US007945058B2

(12) United States Patent
Lee et al.

(10) Patent No.: US 7,945,058 B2
(45) Date of Patent: May 17, 2011

(54) NOISE REDUCTION SYSTEM

(75) Inventors: Kai-Ting Lee, Tainan (TW); Tien-Ju Tsai, Tainan (TW)

(73) Assignee: Himax Technologies Limited, Tainan (TW)

( * ) Notice: Subject to any disclaimer, the term of this patent is extended or adjusted under 35 U.S.C. 154(b) by 1112 days.

(21) Appl. No.: 11/460,449

(22) Filed: Jul. 27, 2006

(65) Prior Publication Data

US 2008/0025528 A1 Jan. 31, 2008

(51) Int. Cl.
*H04B 15/00* (2006.01)
*H03G 7/00* (2006.01)

(52) U.S. Cl. ........................ 381/94.2; 381/106; 381/94.1

(58) Field of Classification Search ................. 381/94.1, 381/94.2, 106, 98, 71.1, 71.11, 71.12; 348/470, 348/E7.052; 375/240.02; 700/94
See application file for complete search history.

(56) References Cited

U.S. PATENT DOCUMENTS

| | | | | |
|---|---|---|---|---|
| 5,796,842 | A * | 8/1998 | Hanna | 381/4 |
| 6,611,603 | B1 * | 8/2003 | Norris et al. | 381/309 |
| 6,944,219 | B2 * | 9/2005 | Mathe | 375/232 |
| 6,999,826 | B1 * | 2/2006 | Zhou et al. | 700/94 |
| 7,436,968 | B2 * | 10/2008 | Ozawa | 381/71.11 |
| 7,536,018 | B2 * | 5/2009 | Onishi et al. | 381/71.8 |
| 2006/0233392 | A1 * | 10/2006 | Koyanagi | 381/98 |

* cited by examiner

*Primary Examiner* — Curtis Kuntz
*Assistant Examiner* — Hai Phan

(57) ABSTRACT

A noise reduction system is used in a BTSC system to reduce noise of an audio signal. The noise reduction system has an audio spectral compressing unit that has a filter and a memory in the approach of the digital processing. The filter is arranged to filter an input signal according to a transfer function, a variable d, and several parameters b0/a0, a0/b0, b1/b0 and a1/a0. The memory is arranged to store the parameters.

22 Claims, 5 Drawing Sheets

NOISE REDUCTION SYSTEM

BACKGROUND

1. Field of Invention

The present invention relates to a noise reduction system, and more particularly relates to a noise reduction system used in the BTSC system.

2. Description of Related Art

In the 1980's, the United States FCC (Federal Communications Commission) adopted new regulations covering the audio portion of television signals that permitted television programs to be broadcast and received with bi-channel audio. In those regulations, the FCC recognized and gave special protection to a method of broadcasting additional audio channels that is also called the BTSC (Broadcast Television System Committee) system. The BTSC system defines MTS (multi-channel television sound) transmission and its audio processing requirements.

FIG. 1 shows a noise reduction system of the prior art. The noise reduction system 110 is used in the BTSC system to reduce noise of an audio signal and generate an encoded audio signal during an encoding process in the approach of the digital processing. The noise reduction system 110 has an audio spectral compressing unit 120, a wideband compression circuit 150, and a multiplier 160 when the noise reduction system 110 is used in the encoding process. The audio spectral compressing unit 120 has a filter 130 and a memory 140. The filter 130 filters an input signal according to a transfer function, a variable d, and several parameters (coefficients of the transfer function). The transfer function is:

$$H(z) = \frac{\frac{b_0}{a_0} + \frac{b_1}{a_0} z^{-1}}{1 + \frac{a_1}{a_0} z^{-1}} \tag{1}$$

The memory 140 is arranged to store the parameters. When the variable d is greater than zero, i.e. d>0, the memory 140 outputs the parameters $(b_0/a_0)^+$, $(b_1/b_0)^+$ and $(a_1/a_0)^+$ to the filter 130; when the variable d is less than zero, i.e. d<0, the memory 140 outputs the parameters $(b_0/a_0)^-$, $(b_1/b_0)^-$ and $(a_1/a_0)^-$ to the filter 130.

From this transfer function (1), the memory 140 needs to store 6 parameters $(b_0/a_0)^+$, $(b_1/b_0)^+$, $(a_1/a_0)^+$, $(b_0/a_0)^-$, $(b_1/b_0)^-$ and $(a_1/a_0)^-$. Because the cost of the memory is proportional to the capacity of the memory, a noise reduction system with a memory of smaller capacity is needed.

SUMMARY

It is therefore an aspect of the present invention to provide a noise reduction system with a memory of smaller capacity.

It is therefore another aspect of the present invention to provide an audio processing unit with a memory of smaller capacity.

According to one preferred embodiment of the present invention, the noise reduction system is used in the BTSC system to reduce the noise of an audio signal during an encoding process in the approach of the digital processing. The noise reduction system has an audio spectral compressing unit when the noise reduction system is used in the encoding process. The audio spectral compressing unit has a filter and a memory. The filter is arranged to filter an input signal according to a transfer function, a variable d, and several parameters $b_0/a_0$, $a_0/b_0$, $b_1/b_0$ and $a_1/a_0$, wherein the transfer function is:

when the variable d is greater than zero:

$$H(z) = \frac{b_0}{a_0} \times \frac{1 + \frac{b_1}{b_0} z^{-1}}{1 + \frac{a_1}{a_0} z^{-1}}$$

when the variable d is less than zero:

$$H(z) = \frac{a_0}{b_0} \times \frac{1 + \frac{a_1}{a_0} z^{-1}}{1 + \frac{b_1}{b_0} z^{-1}}$$

The memory is arranged to store the parameters. When the variable d is greater than 0, i.e. d>0, the memory outputs the parameters $b_0/a_0$, $b_1/b_0$ and $a_1/a_0$ to the filter; when the variable d is less than 0, i.e. d<0, the memory outputs the parameters $a_0/b_0$, $b_1/b_0$ and $a_1/a_0$ to the filter.

According to another preferred embodiment of the present invention, the audio processing unit is used in the BTSC system to process an audio signal of an encoding process in the approach of the digital processing. The audio processing unit has a multiplexer, a memory and a filter. The multiplexer is arranged to select and output several parameter addresses according to a variable d. The memory is arranged to receive the parameter addresses and output several parameters $b_0/a_0$, $a_0/b_0$, $b_1/b_0$ and $a_1/a_0$. When the variable d is greater than 0, i.e. d>0, the memory outputs the parameters $b_0/a_0$, $b_1/b_0$ and $a_1/a_0$; when the variable d is less than 0, i.e. d<0, the memory outputs the parameters $a_0/b_0$, $b_1/b_0$ and $a_1/a_0$. When the audio processing unit is used in the encoding process, the filter is arranged to filter an input signal according to a transfer function, the variable d, and the parameters $b_0/a_0$, $a_0/b_0$, $b_1/b_0$ and $a_1/a_0$, wherein the transfer function is:

when the variable d is greater than 0, i.e. d>0:

$$H(z) = \frac{b_0}{a_0} \times \frac{1 + \frac{b_1}{b_0} z^{-1}}{1 + \frac{a_1}{a_0} z^{-1}}$$

when the variable d is less than 0, i.e. d<0:

$$H(z) = \frac{a_0}{b_0} \times \frac{1 + \frac{a_1}{a_0} z^{-1}}{1 + \frac{b_1}{b_0} z^{-1}}$$

It is to be understood that both the foregoing general description and the following detailed description are examples and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
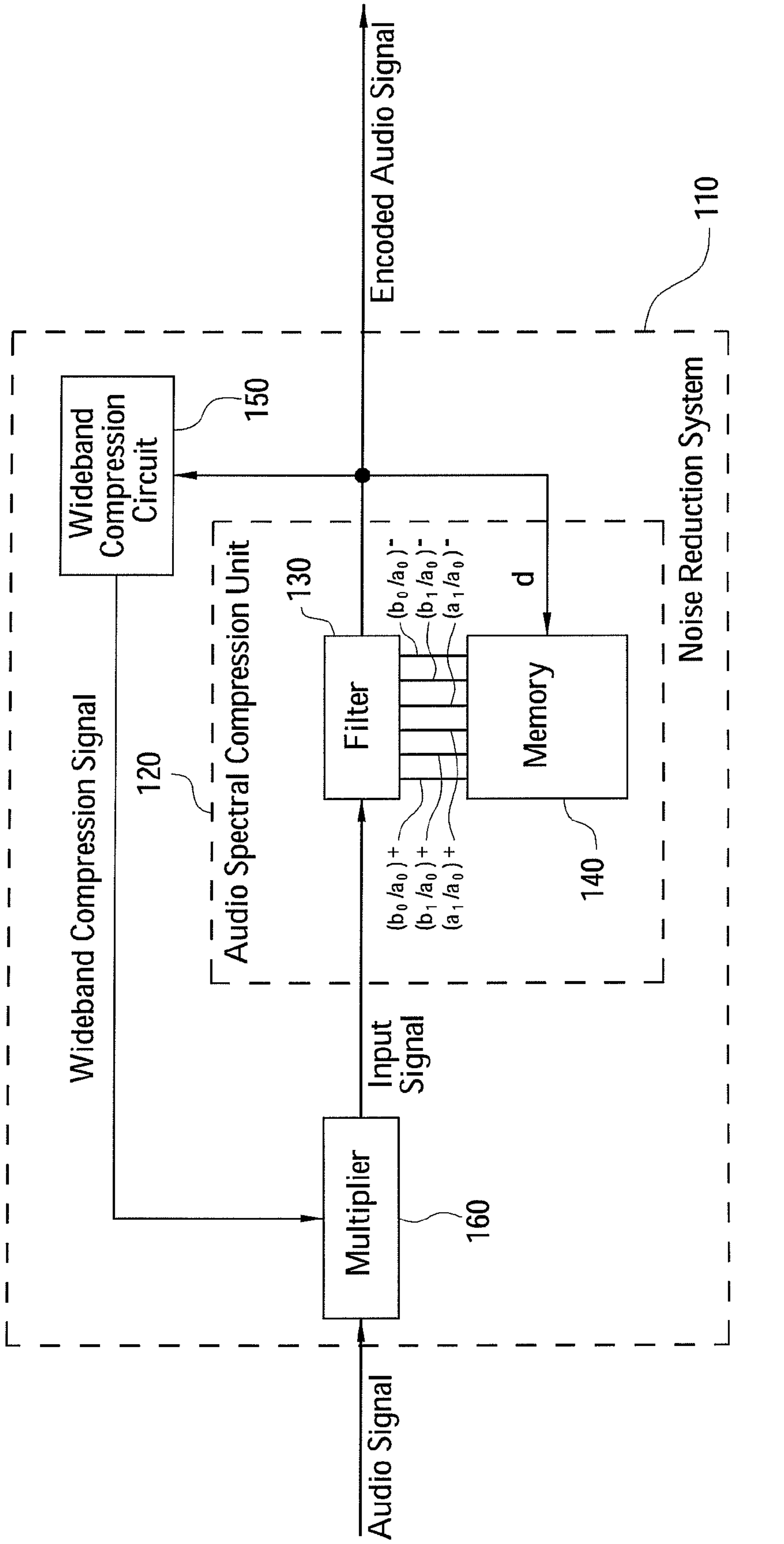
Fig. 1 (Prior Art)
FIG. 1 shows a noise reduction system of the prior art.

Reference will now be made in detail to the present preferred embodiments of the invention, examples of which are illustrated in the accompanying drawings. Wherever possible, the same reference numbers are used in the drawings and the description to refer to the same or like parts.

This invention offers a noise reduction system and an audio processing unit used in the BTSC system to reduce noise during an encoding process or a decoding process in the approach of the digital processing. The filter of the noise reduction system and the audio processing unit uses a new transfer function with fewer parameters (coefficients of the transfer function) to reduce required memory capacity. Using this device, parameters are more economically stored in the memory.

When the filter of the noise reduction system is used for an encoding process, the transfer function is:

$$S(f,b)=[1+(jf/20.1[\text{kHz}])(b+51)/(b+1)]/[1+(jf/20.1[\text{kHz}])(1+51\,b)/(b+1)] \quad (2a)$$

When the filter of the noise reduction system is used for a decoding process, the transfer function is:

$$S^{-1}(f,b)=[1+(jf/20.1[\text{kHz}])(1+51\,b)/(b+1)]/[1+(jf/20.1[\text{kHz}])(b+51)/(b+1)] \quad (2b)$$

Wherein ‘f’ is the frequency of processing signal, ‘b’ is the time-weighted root mean square of the encoded audio signal.

In order to apply the transfer functions (2*a*) and (2*b*) in a digital audio processor, the S(f,b) and $S^{-1}$(f,b) have to be bilinear transformed into Z domain. Therefore set $b=10^{(d/20)}$, i.e. d=20 log (b), and the transfer functions (2*a*) and (2*b*) respectively become:

$$S(Z,b)=[2\pi f(Z+1)(b+1)+2f_s(Z-1)(b+51)]/[2\pi f(Z+1)(b+1)+2f_s(Z-1)(1+51\,b)] \quad (3a)$$

$$S^{-1}(Z,b)=[2\pi f(Z+1)(1+b)+2f_s(Z-1)(1+51b)]/[2\pi f(Z+1)(1+b)+2f_s(Z-1)(b+51)] \quad (3b)$$

where f=20.1 kHz, $f_s$ is the sampling frequency.

In the transfer function (3*b*), $S^{-1}$(Z,b) is equal to S (Z,$b^{-1}$). Thus, the transfer functions (3*a*) and (3*b*) are set to be:

$$\text{When } d>0, S(Z,b)=H(Z)=(b_0+b_1Z^{-1})/(a_0+a_1Z^{-1}) \quad (4a)$$

$$\text{When } d<0, S(Z,b^{-1})=H^{-1}(Z)=(a_0+a_1Z^{-1})/(b_0+b_1Z^{-1}) \quad (4b)$$

In the transfer function (1) of the prior art, the memory needs to store 6 parameters. In order to reduce the amount of the parameters, the transfer functions (4*a*) and (4*b*) are transformed to be:

when the variable d is greater than 0, i.e. d>0:

$$H(z)=\frac{b_0}{a_0}\times\frac{1+\frac{b_1}{b_0}z^{-1}}{1+\frac{a_1}{a_0}z^{-1}} \quad (5a)$$

when the variable d is less than 0, i.e. d<0:

$$H(z)=\frac{a_0}{b_0}\times\frac{1+\frac{a_1}{a_0}z^{-1}}{1+\frac{b_1}{b_0}z^{-1}} \quad (5a)$$

Figure 2A:
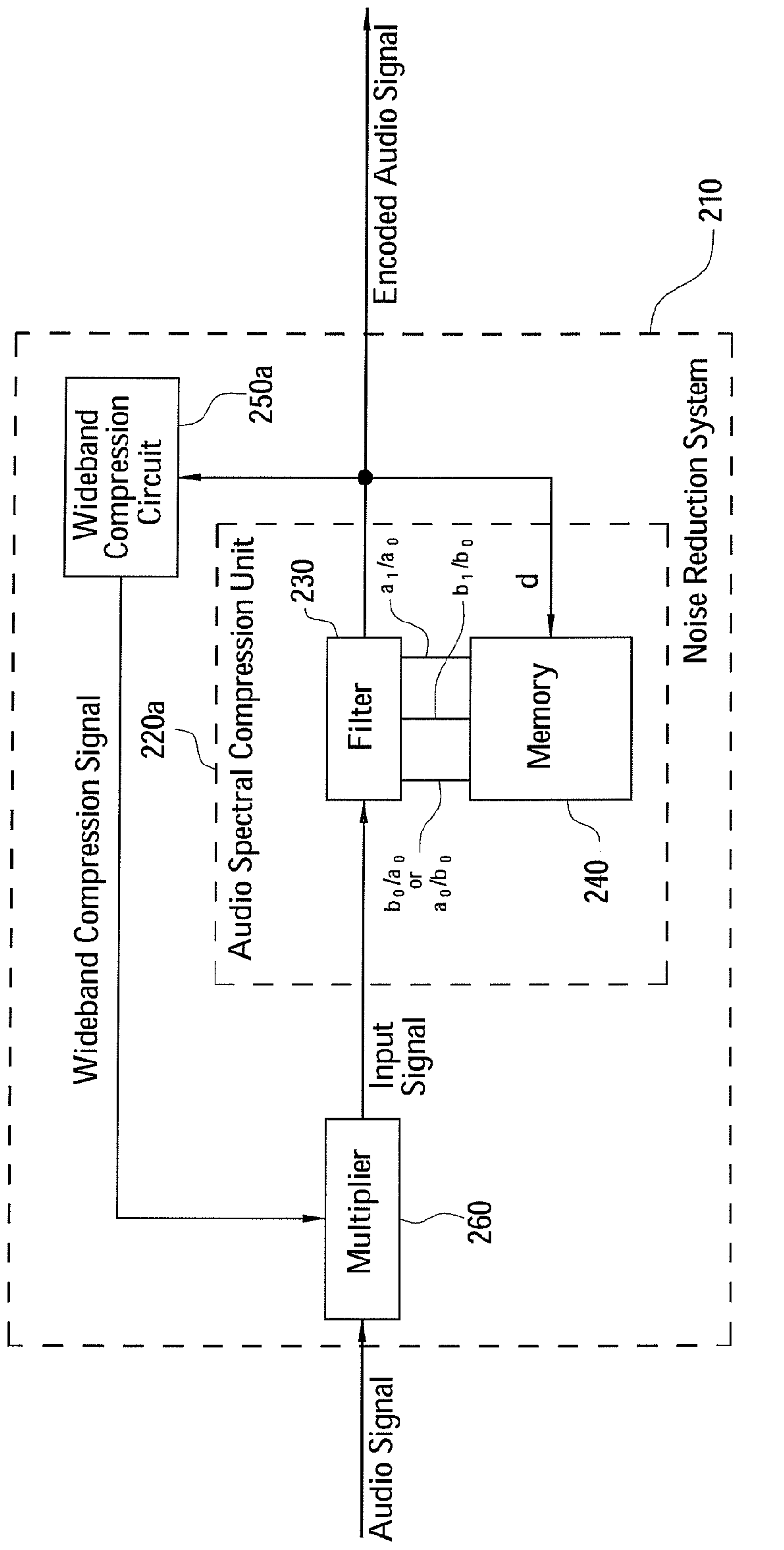
FIG. 2A shows a noise reduction system of a first preferred embodiment of the present invention.

FIG. 2A shows a noise reduction system of a first preferred embodiment of the present invention. The noise reduction system 210 is used in the BTSC system to reduce noise of an audio signal during an encoding process and to generate an encoded audio signal. The noise reduction system 210 has an audio spectral compressing unit 220*a* when the noise reduction system 210 is used in the encoding process. The audio spectral compressing unit 220*a* has a filter 230 and a memory 240. The filter 230 of the audio spectral compression unit 220*a* is arranged to filter an input signal and generate the encoded audio signal according to a transfer function, a variable d, and several parameters (coefficients of the transfer function) $b_0/a_0$, $a_0/b_0$, $b_1/b_0$ and $a_1/a_0$. The transfer functions are (5a) and (5*b*):

when the variable d is greater than 0, i.e. d>0:

$$H(z)=\frac{b_0}{a_0}\times\frac{1+\frac{b_1}{b_0}z^{-1}}{1+\frac{a_1}{a_0}z^{-1}} \quad (5a)$$

when the variable d is less than 0, i.e. d<0:

$$H(z)=\frac{a_0}{b_0}\times\frac{1+\frac{a_1}{a_0}z^{-1}}{1+\frac{b_1}{b_0}z^{-1}} \quad (5a)$$

The memory 240 is arranged to store the parameters, when the variable d is greater than 0, i.e. d>0, the memory outputs the parameters $b_0/a_0$, $b_1/b_0$ and $a_1/a_0$ to the filter 230; when the variable d is less than 0, i.e. d<0, the memory outputs the parameters $a_0/b_0$, $b_1/b_0$ and $a_1/a_0$ to the filter 230.

From this transfer function, the memory just needs to store 4 parameters $b_0/a_0$, $a_0/b_0$, $b_1/b_0$ and $a_1/a_0$. Furthermore, the parameter $a_0/b_0$ can be generated from the parameter $b_0/a_0$ by using hardware (such as a circuit). Therefore, compared with the conventional memory that stores 6 parameters in the noise reduction system, this memory just needs to store 3~4 parameters. This memory needs only ½~⅔ capacity of conventional memory.

The variable d is an address of the memory, and the variable d is equal to 20 µg (the time-weighted root mean square of the encoded audio signal). In order to get equal filter frequency response of the parameter d>0 and d<0, the range of the variable d is about ±35[decibel ERMS] to about ±45[decibel ERMS].

When the noise reduction system 210 is used in the encoding process, a wideband compression unit 250*a* coupled to the memory 240 and the filter 230 in the noise reduction system compresses the encoded audio signal into a wideband compression signal. The noise reduction system 210 further has a multiplier 260 coupled to the wideband compression unit 250*a* and the filter 230. The multiplier 260 generates the input signal by multiplying the audio signal with the wideband compression signal.

In real products, the memory 240 in the noise reduction system 210 is conventionally implemented with a ROM table, such as a look up ROM table.

Figure 2B:
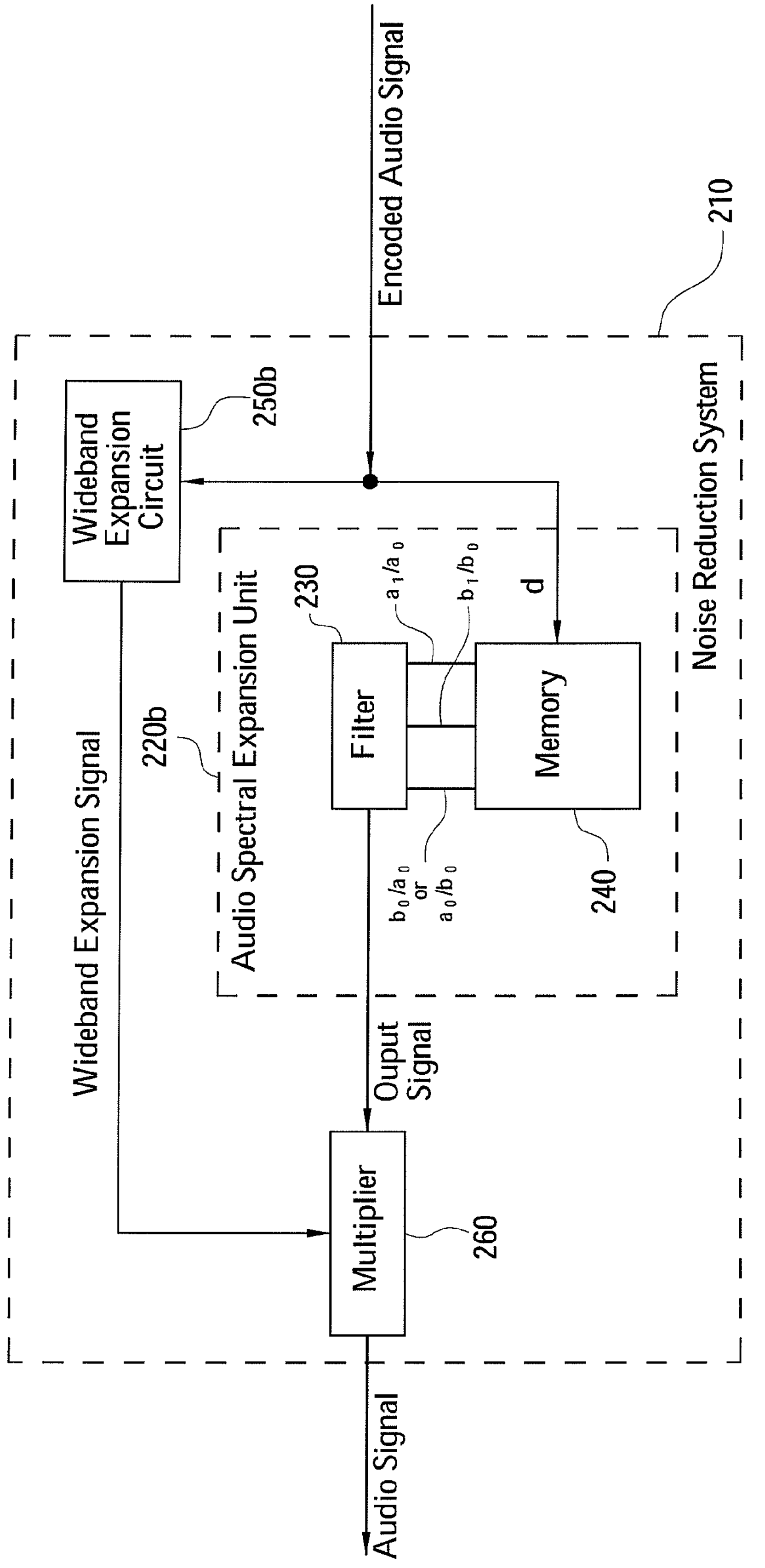
FIG. 2B shows a noise reduction system of a second preferred embodiment of the present invention.

FIG. 2B shows a noise reduction system of a second preferred embodiment of the present invention. The noise reduction system 210 is used in the BTSC system to reduce noise of an encoded audio signal during a decoding process and to generate an audio signal in the approach of the digital processing. The difference between FIG. 2A and FIG. 2B is that the noise reduction system 210 of FIG. 2B has an audio spectral expansion unit 220*b* when the noise reduction system is used in the decoding process.

The filter 230 of the audio spectral expansion unit 220*b* is arranged to filter the encoded signal and generate an output signal according to an inverse of the transfer function, the variable d, and the parameters $b_0/a_0$, $a_0/b_0$, $b_1/b_0$ and $a_1/a_0$ as described in FIG. 2A.

When the noise reduction system 210 is used in the decoding process, a wideband expansion unit 250*b* coupled to the memory 240 in the noise reduction system expands the encoded audio signal to be a wideband expansion signal. The noise reduction system 210 further has a multiplier 260. The multiplier 260 coupled to the wideband expansion unit 250*b* and the filter 230 is arranged to multiply the output signal with the wideband expansion signal to be the audio signal.

Figure 3A:
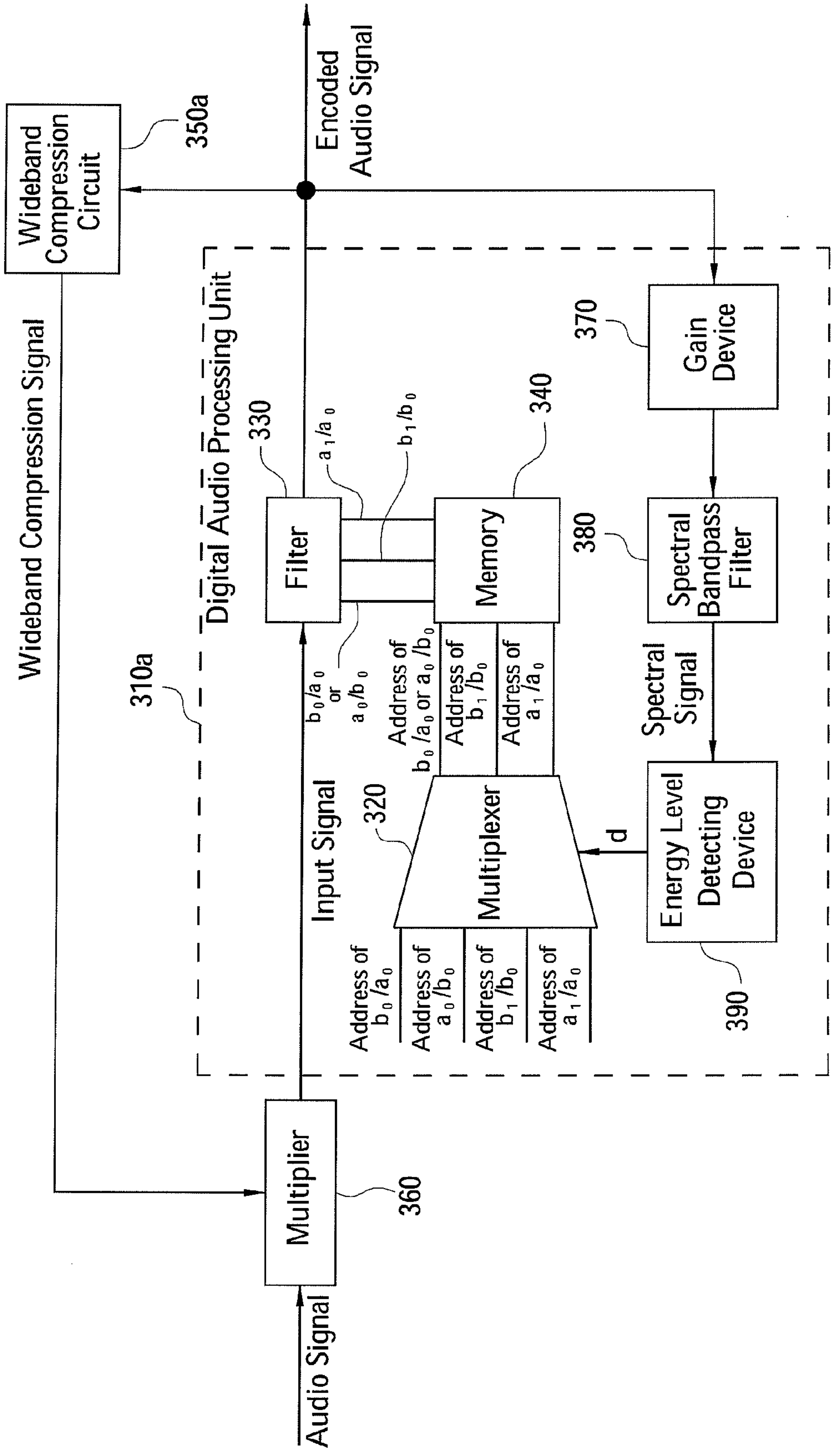
FIG. 3A shows a digital audio processing unit of a third preferred embodiment of the present invention.

FIG. 3A shows a digital audio processing unit of a third preferred embodiment of the present invention. The digital audio processing unit 310*a* is used in the BTSC system to process an audio signal of an encoding process and to generate an encoded audio signal. The digital audio processing unit 310*a* has a multiplexer 320, a memory 340 and a filter 330. The multiplexer 320 is arranged to select and output several parameter addresses according to a variable d. When the variable d is greater than 0, i.e. d>0, the multiplexer 320 outputs addresses of parameters $b_0/a_0$, $b_1/b_0$ and $a_1/a_0$. When the variable d is less than 0, i.e. d<0, the multiplexer 320 outputs addresses of parameter $a_0/b_0$, $b_1/b_0$ and $a_1/a_0$.

The memory 340 coupled to the multiplexer is arranged to receive the parameter addresses and output several parameters $b_0/a_0$, $a_0/b_0$, $b_1/b_0$ and $a_1/a_0$. When the variable d is greater than 0, i.e. d>0, the memory outputs the parameters $b_0/a_0$, $b_1/b_0$ and $a_1/a_0$ to the filter 330. When the variable d is less than 0, i.e. d<0, the memory outputs the parameters $a_0/b_0$, $b_1/b_0$ and $a_1/a_0$ to the filter 330.

The filter 330 is coupled to the memory. When the audio processing unit 330 is used in the encoding process, the filter 330 is arranged to filter an input signal according to a transfer function, the variable d, and the parameters $b_0/a_0$, $a_0/b_0$, $b_1/b_0$ and $a_1/a_0$. The transfer functions are equations (5a) and (5b) as described above.

In the digital audio processing unit 310*a*, the multiplexer 320 can be configured in the memory, and the variable d is an address of the memory. Furthermore, the variable d is 20 log (the time-weighted root mean square of the encoded audio signal). In order to get equal filter frequency response for the parameter d>0 and the parameter d<0, the range of the variable d is about ±35[decibel ERMS] to about ±45[decibel ERMS].

The digital audio processing unit 310*a* further has a gain device 370, a spectral bandpass filter 380, and an energy level detecting device 390. The gain device 370 is coupled to the filter 330 to receive and increase the gain of the encoded audio signal. The spectral bandpass filter 380 is coupled to the gain device 370 to generate a spectral signal according to the encoded audio signal with increasing gain. The energy level detecting device 390 is coupled to the spectral bandpass filter 380 and the multiplexer 320 to generate the variable d according to the spectral signal.

When the digital audio processing unit 310*a* is used in the encoding process, a wideband compression unit 350*a* coupled to the gain device and the filter 330 compresses the encoded audio signal into a wideband compression signal. The digital audio processing unit 310*a* further has a multiplier 360 coupled to the wideband compression unit 350*a* and the filter 330. The multiplier 360 generates the input signal by multiplying the audio signal with the wideband compression signal.

In real products, the memory 340 in the digital audio processing unit 310*a* is conventionally implemented by a ROM table, such as a look up ROM table.

Figure 3B:
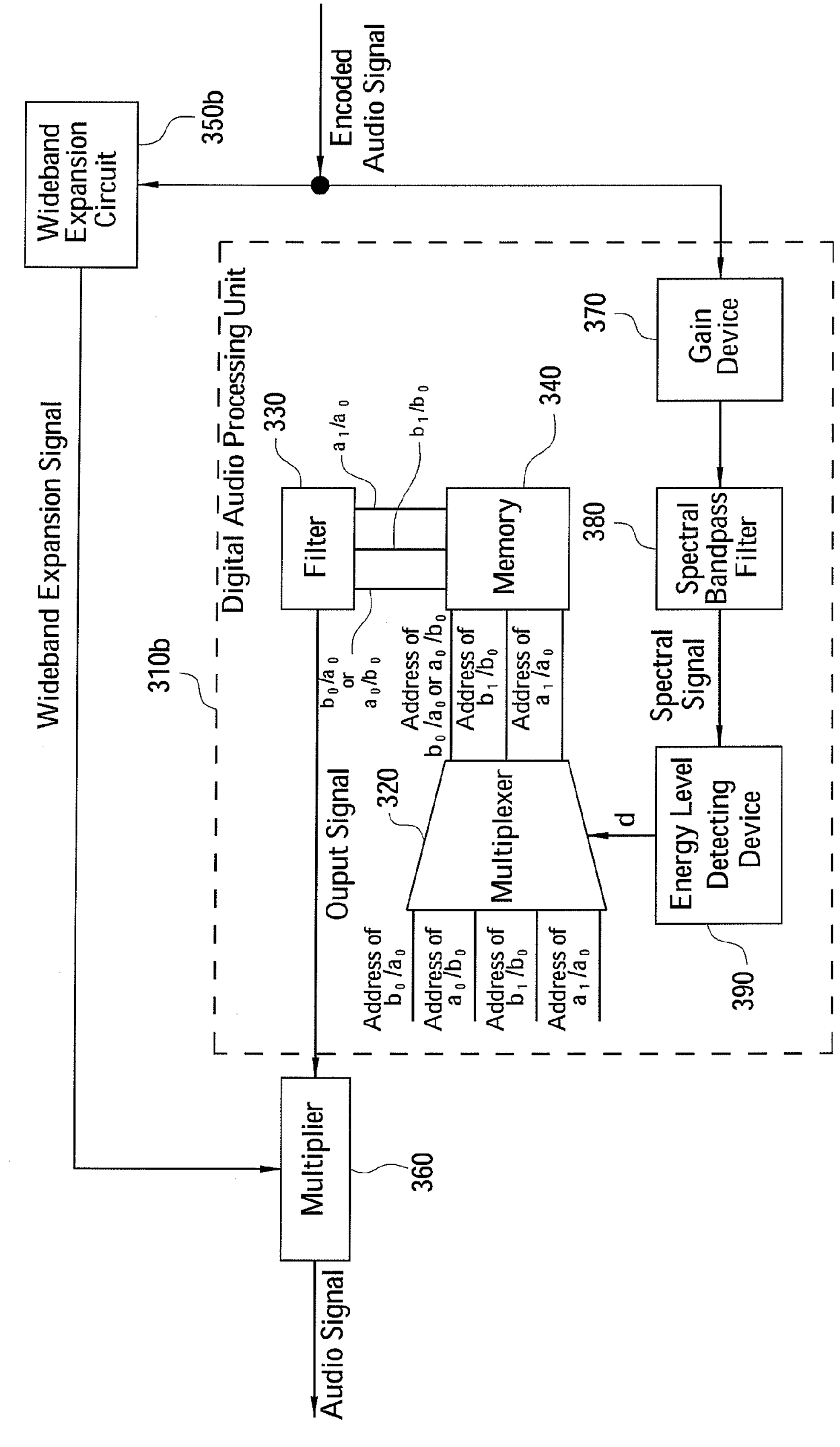
FIG. 3B shows a digital audio processing unit of a fourth preferred embodiment of the present invention.

FIG. 3B shows a digital audio processing unit of a fourth preferred embodiment of the present invention. The digital audio processing unit 310*b* is used in the BTSC system to process an encoded audio signal of a decoding process and to generate an audio signal.

When the digital audio processing unit 310*b* is used in the decoding process, the filter 330 is arranged to filter the encoded signal and generate an output signal according to an inverse of the transfer function, the variable d, and the parameters b0/a0, a0/b0, b1/b0 and a1/a0.

When the digital audio processing unit 310*b* is used in the decoding process, the digital audio processing unit 310*b* further has a wideband expansion unit 350*b* coupled to the gain device 370 to expand the encoded audio signal into a wideband expansion signal. The digital audio processing unit 310*b* further has a multiplier 360. The multiplier 360 coupled to the wideband expansion unit 350*b* and the filter 330 generates the audio signal by multiplying the output signal with the wideband expansion signal.

Using the noise reduction system or the audio processing unit described above, this memory needs only ½~⅔ capacity of a conventional memory. The audio processing data of the multimedia in real life is very huge, the noise reduction system and the audio processing unit can reduce the necessary memory capacity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A noise reduction system used in a BTSC (Broadcast Television System Committee) system to reduce noise of an audio signal z during an encoding process prior to digital processing, the noise reduction system comprising an audio spectral compressing unit including:

a filter arranged to filter an input signal according to a transfer function, H(z), having a plurality of parameters, wherein the plurality of parameters are determined based upon a variable d equal to 20 log X, wherein X is the time-weighted root mean square of the encoded audio signal z; and a memory configured to output parameters $b_0/a_0$, $b_1/b_0$ and $a_1/a_0$ to the transfer function when a value of d is greater than 0, and output parameters $a_0/b_0$, $b_1/b_0$ and $a_1/a_0$ when the value of d is less than 0;

wherein when the value of variable d is greater than 0, the transfer function is:

$$H(z) = \frac{b_0}{a_0} \times \frac{1 + \frac{b_1}{b_0}z^{-1}}{1 + \frac{a_1}{a_0}z^{-1}}$$

and when the value of variable d is less than 0, the transfer function is:

$$H(z) = \frac{a_0}{b_0} \times \frac{1 + \frac{a_1}{a_0}z^{-1}}{1 + \frac{b_1}{b_0}z^{-1}}.$$

2. The noise reduction system claimed in claim 1, wherein the variable d corresponds to an address of the memory.

3. The noise reduction system claimed in claim 1, wherein the range of the variable d is about ±35 decibels ERMS to about ±45 decibels ERMS.

4. The noise reduction system claimed in claim 1, wherein when the noise reduction system is used in the encoding process, the noise reduction system further comprises a wideband compression unit to compress the encoded audio signal to a wideband compression signal.

5. The noise reduction system claimed in claim 4, further comprising a multiplier in the noise reduction system for multiplying the audio signal with the wideband compression signal to be an input signal.

6. The noise reduction system claimed in claim 1, wherein the memory is a ROM table.

7. The noise reduction system claimed in claim 1, wherein the noise reduction system is used in the BTSC system to reduce noise of an encoded audio signal during a decoding process prior to digital processing.

8. The noise reduction system claimed in claim 7, wherein the noise reduction system comprises an audio spectral expansion unit when the noise reduction system is used in the decoding process, the audio spectral expansion unit having a filter configured to filter the encoded signal according to an inverse of the transfer function, the variable d, and the parameters $b_0/a_0$, $a_0/b_0$, $b_1/b_0$ and $a_1/a_0$.

9. The noise reduction system claimed in claim 7, wherein when the noise reduction system is used in the decoding process, the noise reduction system further comprises a wideband expansion unit to expand the encoded audio signal to be a wideband expansion signal.

10. The noise reduction system claimed in claim 7, wherein the multiplier is configured to multiply an output signal with a wideband expansion signal to be the audio signal.

11. A digital audio processing unit used in a BTSC (Broadcast Television System Committee) system to process an audio signal during an encoding process, the audio processing unit comprising:

a multiplexer configured to select and output a plurality of parameter addresses according to a variable d, wherein the variable d is equal to 20 log X, wherein X is the time-weighted root mean square of the encoded audio signal z;

a memory coupled to the multiplexer and configured to receive the parameter addresses and output a plurality of parameters $b_0/a_0$, $a_0/b_0$, $b_1/b_0$ and $a_1/a_0$, the memory configured to output the parameters $b_0/a_0$, $b_1/b_0$ and $a_1/a_0$ when the variable d is greater than 0; and output the parameters $a_0/b_0$, $b_1/b_0$ and $a_1/a_0$ when the variable d is less than 0; and a filter coupled to the memory, wherein when the audio processing unit is used in the encoding process, the filter is configured to filter an input signal according to a transfer function, the variable d, and the parameters $b_0/a_0$, $a_0/b_0$, $b_1/b_0$ and $a_1/a_0$, wherein when a value of the variable d is greater than 0, the transfer function is:

$$H(z) = \frac{b_0}{a_0} \times \frac{1 + \frac{b_1}{b_0}z^{-1}}{1 + \frac{a_1}{a_0}z^{-1}}$$

and when the value of variable d is less than 0, the transfer function is:

$$H(z) = \frac{a_0}{b_0} \times \frac{1 + \frac{a_1}{a_0}z^{-1}}{1 + \frac{b_1}{b_0}z^{-1}}.$$

12. The digital audio processing unit claimed in claim 11, wherein the range of the variable d is about ±35 decibels ERMS to about ±45 decibels ERMS.

13. The digital audio processing unit claimed in claim 11, further comprising a gain device arranged to receive the encoded audio signal and increase the gain of the encoded audio signal.

14. The digital audio processing unit claimed in claim 13, further comprising a spectral bandpass filter coupled to the gain device to generate a spectral signal according to the encoded audio signal with increasing gain.

15. The digital audio processing unit claimed in claim 14, further comprising an energy level detecting device coupled to the spectral bandpass filter and the multiplexer to generate the variable d according to the spectral signal.

16. The digital audio processing unit claimed in claim 11, wherein when the audio processing unit is used in the encoding process, the digital audio processing unit further comprises a wideband compression unit coupled to a gain device and the filter to compress the encoded audio signal into a wideband compression signal.

17. The digital audio processing unit claimed in claim 16, further comprising a multiplier coupled to the wideband compression unit and the filter to multiply the audio signal with the wideband compression signal to be an input signal.

18. The digital audio processing unit claimed in claim 11, wherein the memory is a ROM table.

19. The digital audio processing unit claimed in claim 11, wherein the audio processing unit is used in the BTSC system to process an encoded audio signal of a decoding process.

20. The digital audio processing unit claimed in claim 19, wherein when the audio processing unit is used in the decoding process, the filter is arranged to filter the encoded signal and generate an output signal according to an inverse of the transfer function, the variable d, and the parameters $b_0/a_0$, $a_0/b_0$, $b_1/b_0$ and $a_1/a_0$.

21. The digital audio processing unit claimed in claim 19, wherein when the audio processing unit is used in the decoding process, the digital audio processing unit further comprises a wideband expansion unit coupled to a gain device to expand the encoded audio signal into a wideband expansion signal.

22. The digital audio processing unit claimed in claim 19, wherein a multiplier coupled to the wideband expansion unit is arranged to multiply an output signal with the wideband expansion signal to be the audio signal.

* * * * *